US010373851B2

(12) United States Patent
Abe et al.

(10) Patent No.: US 10,373,851 B2
(45) Date of Patent: Aug. 6, 2019

(54) CONTAINER STORAGE FACILITY

(71) Applicant: Daifuku Co., Ltd., Osaka (JP)

(72) Inventors: Takeshi Abe, Hinocho (JP); Tadahiro Yoshimoto, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 15/698,096

(22) Filed: Sep. 7, 2017

(65) Prior Publication Data

US 2018/0076073 A1 Mar. 15, 2018

(30) Foreign Application Priority Data

Sep. 9, 2016 (JP) ................................ 2016-176977

(51) Int. Cl.

*H01L 21/673* (2006.01)
*H01L 21/67* (2006.01)
*H01L 21/677* (2006.01)

(52) U.S. Cl.

CPC .. *H01L 21/67389* (2013.01); *H01L 21/67276* (2013.01); *H01L 21/67393* (2013.01); *H01L 21/67769* (2013.01); *H01L 21/67775* (2013.01); *H01L 21/67386* (2013.01); *H01L 21/67766* (2013.01)

(58) Field of Classification Search

None
See application file for complete search history.

(56) References Cited

U.S. PATENT DOCUMENTS 7,318,697 B2 * 1/2008 Wu ..................... H01L 21/6734 414/217
9,064,918 B2 * 6/2015 Takahara .......... H01L 21/67769
9,190,305 B2 * 11/2015 Yi ..................... H01L 21/67294
2006/0043197 A1 * 3/2006 Chang .................. G05B 19/128 235/492
2017/0133254 A1 5/2017 Murata et al.

FOREIGN PATENT DOCUMENTS

WO 2015194255 A1 12/2015

* cited by examiner

*Primary Examiner* — Mark C Hageman
(74) *Attorney, Agent, or Firm* — The Webb Law Firm

(57) ABSTRACT

A container storage facility includes a storage rack having a plurality of storage sections as storage section groups, a gas supply device configured to supply a cleaning gas to the storage sections via a branch-type supply pipe, a transport apparatus configured to transport containers to the storage sections, and a control unit configured to control operations of the transport apparatus. When a plurality of containers are to be stored in the storage sections, the control unit controls the operations of the transport apparatus so as to transport the containers of the same type to the storage sections that belong to the same storage section group.

5 Claims, 13 Drawing Sheets

CONTAINER STORAGE FACILITY

CROSS-REFERENCE TO RELATED APPLICATION

This application claims priority to Japanese Patent Application No. 2016-176977 filed Sep. 9, 2016, the disclosure of which is hereby incorporated in its entirety by reference.

FIELD OF THE INVENTION

The present invention relates to a container storage facility for storing containers.

BACKGROUND

For example, in a manufacturing process of industrial products, a container storage facility is used to temporarily store containers that accommodate materials, intermediate products, or the like while waiting for a process or the like to be performed. For example, if an item contained in a container is a semiconductor substrate, a reticle substrate, or the like, a container storage facility that is configured to be able to supply a cleaning gas into the stored containers is used in order to avoid contamination of the surface of the substrates while being stored.

As an example, WO 2015/194255A (Patent Document 1) discloses a container storage facility that includes a storage rack (rack 7) that has a plurality of storage sections (storage shelves 7A), and gas supply devices (purge devices 30) for supplying a cleaning gas to the respective storage sections. In the container storage facility in Patent Document 1, the gas supply devices are divided into a plurality of groups (group 1, group 2, . . . group M), and are configured so that each group supplies cleaning gas via branch-type supply pipe (main pipe 412 and supply pipes 33). Note that, in the following description, a group of storage sections that are supplied with cleaning gas from a shared supply pipe will be referred to as a "storage section group".

In Patent Document 1, containers [storage containers F] stored are handled equally without being distinguished from one another. However, usually, the cleaning gas supplied into the containers is discharged to the outside by an amount by which the pressure of the cleaning gas exceeds a predetermined pressure. If, for example, the manufacturers of the containers are different, the value of ventilation resistance when the cleaning gas flows through the respective containers may differ in some cases. In addition, if the containers are made by the same manufacturer but are of different models, similarly, the value of ventilation resistance when the cleaning gas flows through the respective containers may differ in some cases. For this reason, if a plurality of containers are stored without any specific intention, the flow rate of actually supplied cleaning gas may vary due to a difference in the value of ventilation resistance among a plurality of containers that belong to the same storage section group (i.e. that receive a supply of the cleaning gas from the shared supply pipe).

SUMMARY OF THE INVENTION

Realization of a container storage facility is desired in which the flow rate of actually supplied cleaning gas can be made as uniform as possible among a plurality of containers stored in storage sections that belong to the same storage section group.

A container storage facility according to the present invention is a container storage facility including:

a storage rack having a plurality of storage sections in a state of being segmented into a plurality of storage section groups;

a gas supply device configured to supply a cleaning gas to the storage sections for each of the storage section groups;

a transport apparatus configured to transport containers to the storage sections; and a control unit configured to control operation of the transport apparatus, wherein the containers are categorized into a plurality of types according to a value of ventilation resistance when the cleaning gas flows through the containers, and when a plurality of containers are to be stored in the storage sections, the control unit controls the operation of the transport apparatus so as to transport containers of the same type to the storage sections that belong to the same storage section group.

With this configuration, the containers with similar values of ventilation resistance when the cleaning gas flows therethrough are stored in the storage sections that belong to the same storage section group. That is to say, a plurality of containers are categorized by the value of ventilation resistance value into types of containers with similar values of ventilation resistance, and the respective types of containers are collectively stored in any of the storage section group. Accordingly, the flow rate of actually supplied cleaning gas can be made as uniform as possible among a plurality of containers stored in storage sections that belong to the same storage section group.

Further features and advantages of the present invention will become more apparent from the following exemplary and non-limiting embodiments described with reference to the drawings.

DETAILED DESCRIPTION

First Embodiment

The first embodiment of a container storage facility will be described with reference to the drawings. A container storage facility 1 according to this embodiment is a type of an article storage facility, and accommodates containers 7, which serve as articles. This container storage facility 1 is used in, for example, a manufacturing process of industrial products, to temporarily store materials, intermediate products, or the like while waiting for a process or the like to be performed, or store finished articles.

Figure 1:
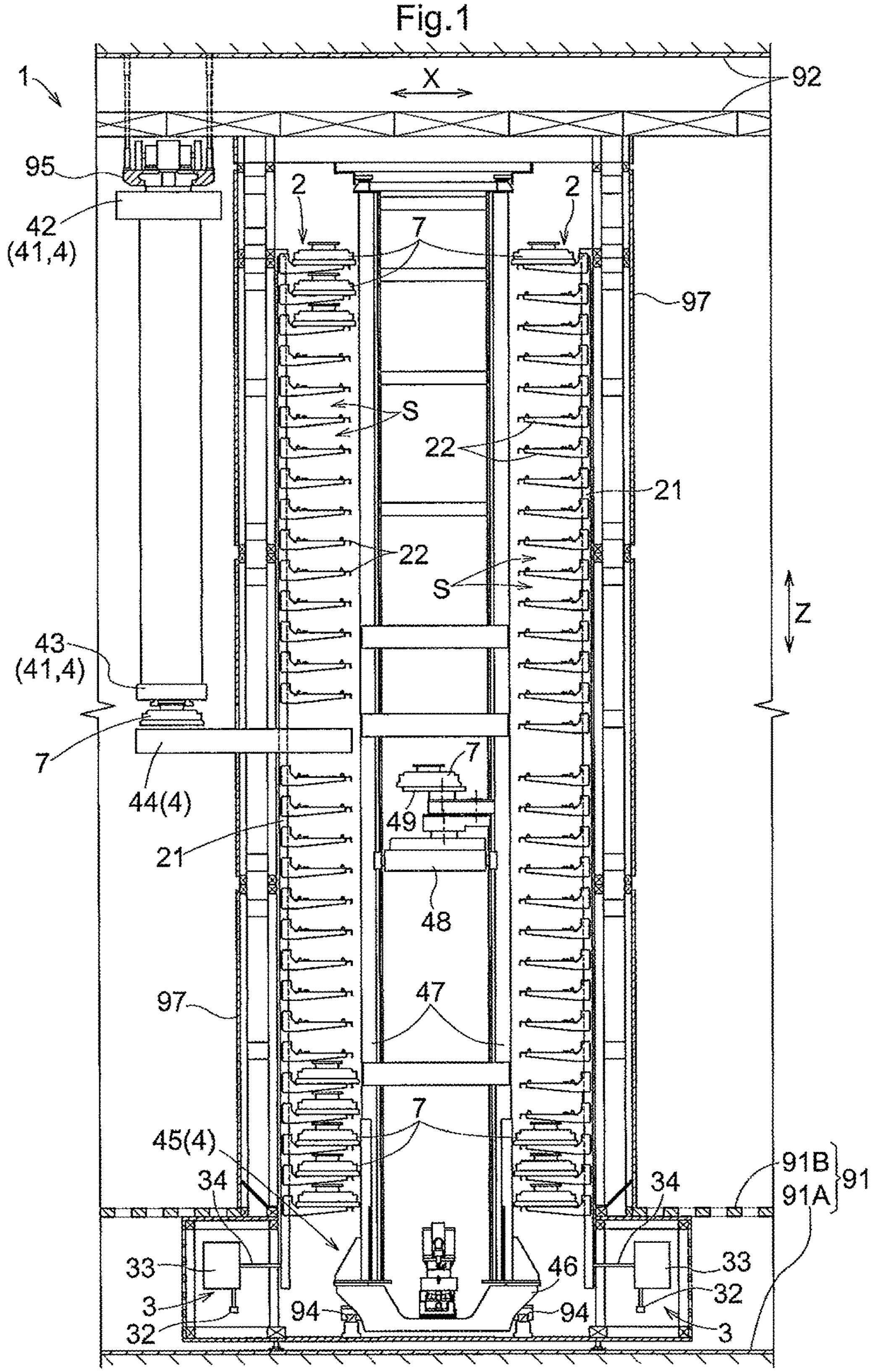
FIG. 1 is a schematic diagram of a container storage facility according to a first embodiment.
Figure 6:
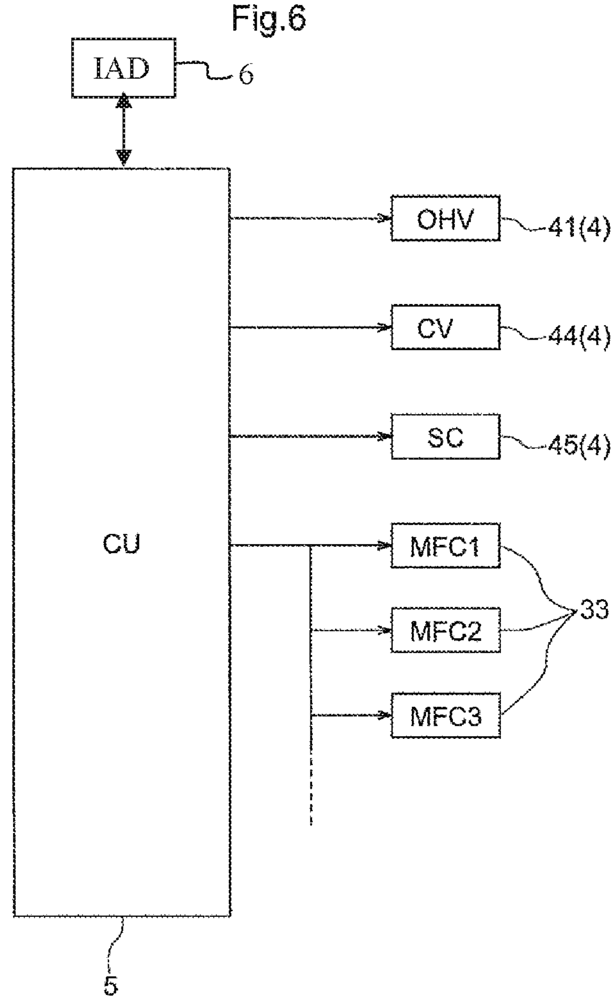
FIG. 6 is a block diagram showing a control system in the container storage facility.

As shown in FIG. 1, the container storage facility 1 includes storage racks 2 having a plurality of storage sections S, a transport apparatus 4 for transporting containers 7 to the storage sections S, and a control unit 5 for controlling operations of the transport apparatus 4 (see FIG. 6). This embodiment describes, as an example, the container storage facility 1 that includes an overhead hoist vehicle 41, a conveyor 44, and a stacker crane 45, which serve as the transport apparatus 4. The container storage facility 1 also includes gas supply devices 3 for supplying a cleaning gas to the respective storage sections S.

The container storage facility 1 according to this embodiment is installed in a clean room. This clean room is of a downflow type, in which gas flows from a ceiling 92 side toward a floor 91. The floor 91 includes a lower floor 91A, and an upper floor 91B that is provided above the lower floor 91A. The lower floor 91A is made of concrete, for example. A traveling rail 94 is laid on the lower floor 91A. The upper floor 91B is constituted by a grated floor in which a plurality of ventilation holes are formed, for example. In this embodiment, the ceiling 92 is configured as a double ceiling. A ceiling rail 95 is provided on the ceiling 92.

Figure 2:
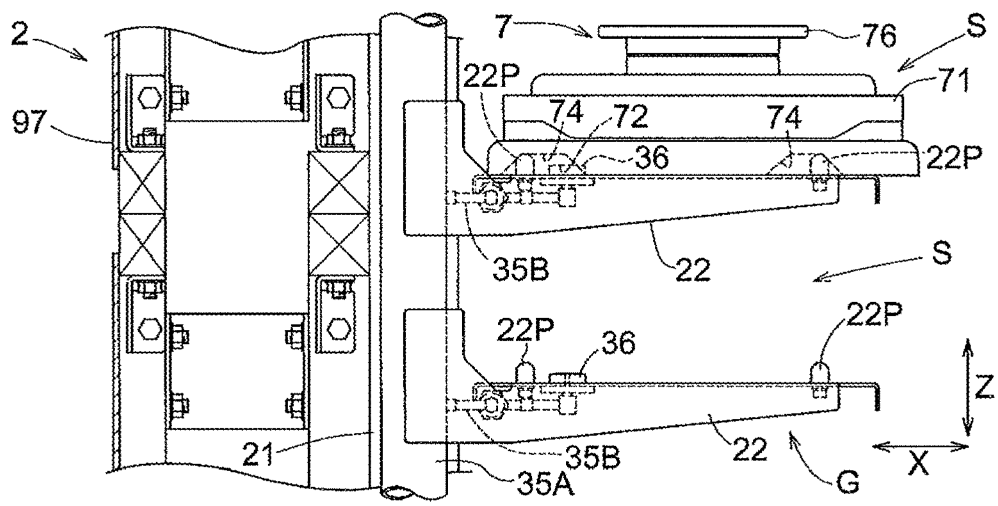
FIG. 2 is a side view of storage sections.
Figure 3:
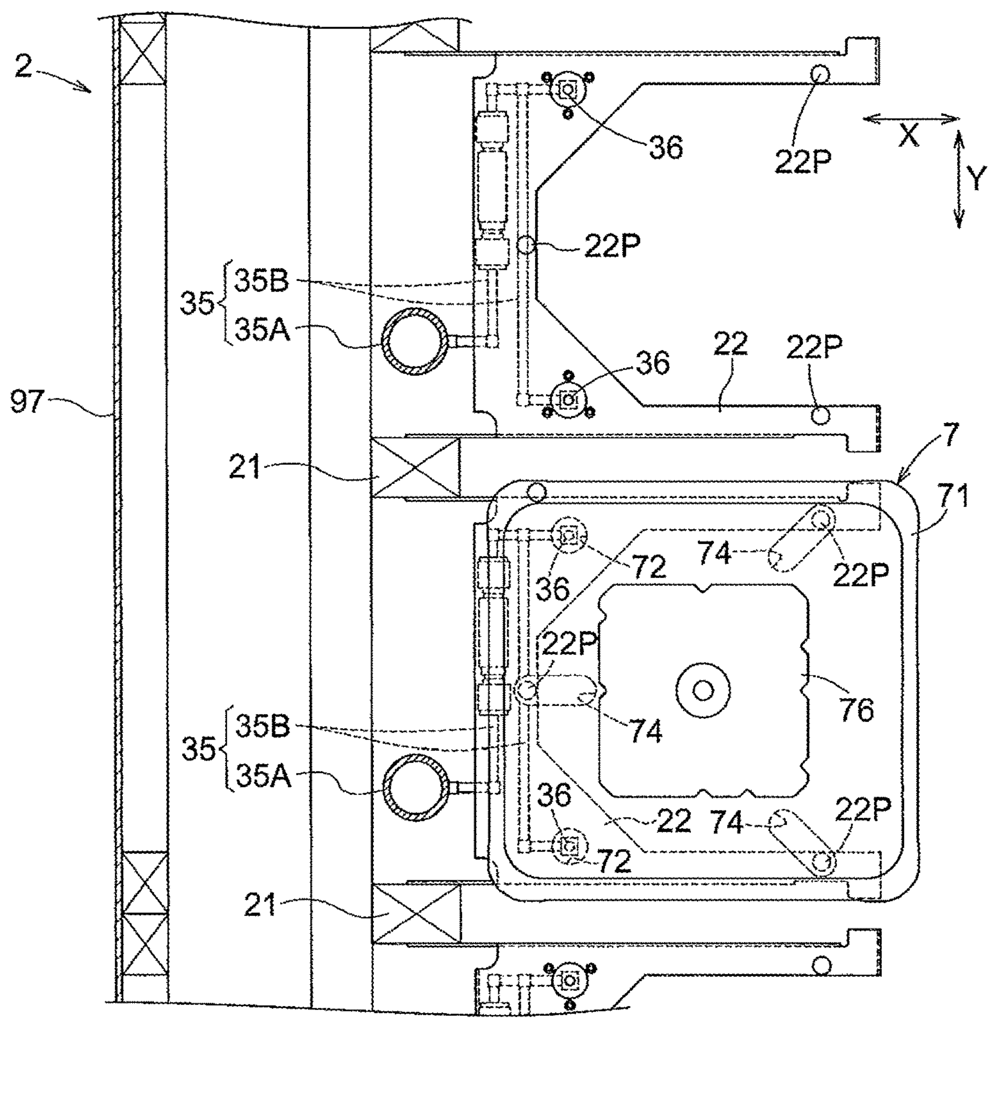
FIG. 3 is a plan view of the storage sections.
Figure 4:
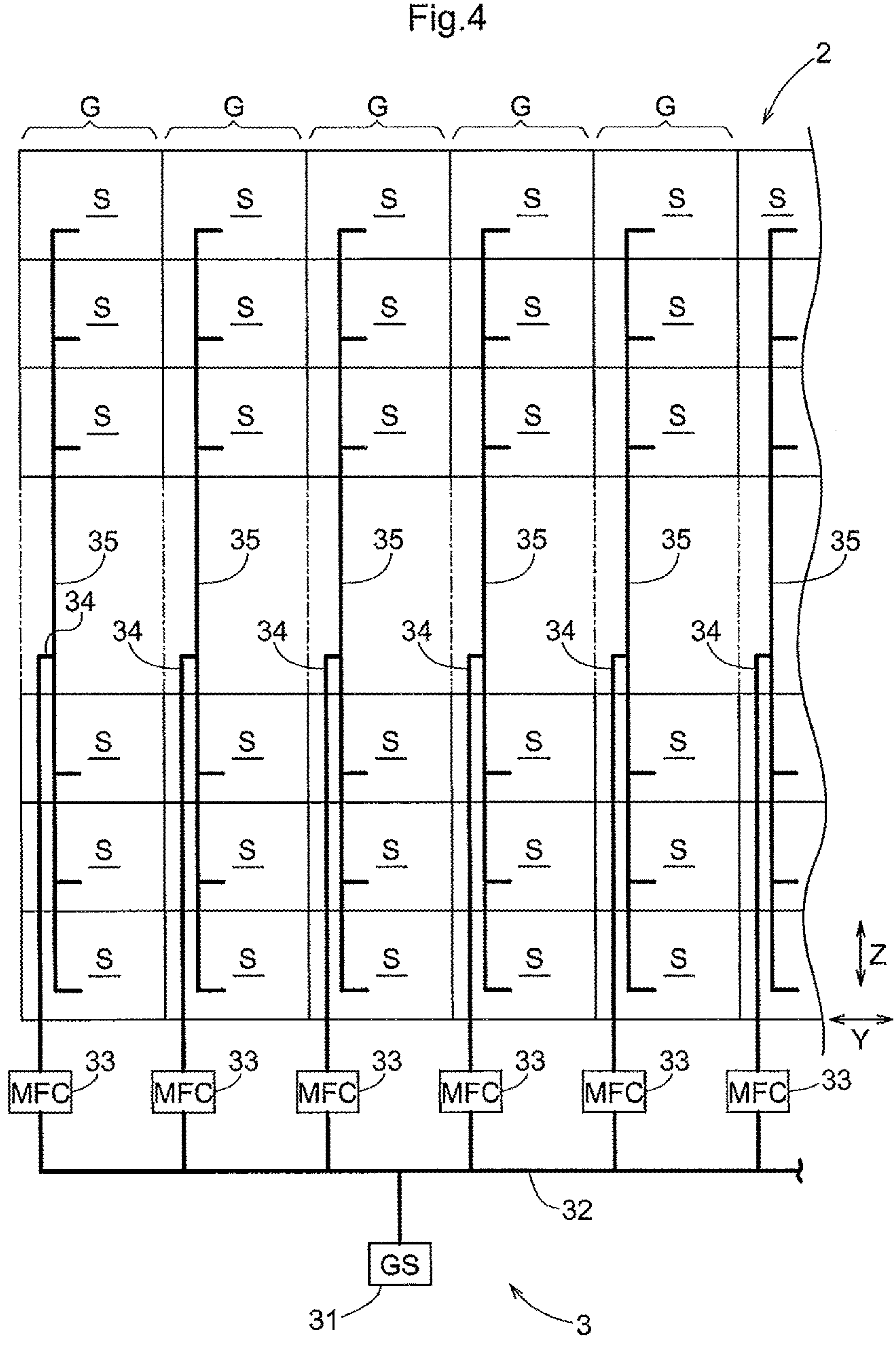
FIG. 4 is a schematic diagram of a storage rack and a gas supply device.

The storage racks 2 are installed in a space between partition walls 97, which are provided between the upper floor 91B and the ceiling 92. A pair of storage racks 2 are provided in a state of opposing each other with the stacker crane 45, which constitutes the transport apparatus 4, therebetween. In this embodiment, the direction in which the pair of storage racks 2 are arranged will be referred to as a "front-rear direction X", and a lateral width direction of the storage racks 2 will be referred to as a "left-right direction Y". As shown in FIGS. 2 and 3, the pair of storage racks 2 have a plurality of support columns 21, which are arranged in the left-right direction Y, and a plurality of holder plates 22, which span a pair of support columns 21 that are adjacent to each other in the left-right direction Y, the holder plates 22 being fixed in a state of being arranged in an up-down direction Z. The holder plates 22 support the containers 7 that are placed thereon. Thus, storage sections S are formed as spaces between a pair of holder plates 22 that are adjacent to each other in the up-down direction Z. As shown in FIG. 4, the storage racks 2 each have a plurality of storage sections S in a state of being arranged in the up-down direction Z and the left-right direction Y.

As shown in FIGS. 2 and 3, the holder plates 22 are fixed to and supported by the support columns 21 on one end side in the front-rear direction X, and are open on the other side. The holder plates 22 are thus fixed to the support columns 21 in a cantilevered manner. The holder plates 22 are each formed in a U-shape as seen in a plan view. "In a U-shape" refers to a shape that can be regarded as an alphabetic character "U", or can be schematically regarded as a character "U" as a whole even if somewhat different from that of a character "U" (hereinafter, other similar expressions regarding shapes such as "shaped" also have a similar meaning). The U-shaped holder plates 22 each support three sides of a bottom face of a container 7. The holder plates 22 are each provided with protruding pins 22P, which protrude upward, at three portions that are the lower end portion and both sides of the U-shape.

In this embodiment, a reticle pod for accommodating a reticle (photomask) is used as each of the containers 7. The containers 7 each have a main body 71 for accommodating a reticle, and a flange portion 76, which is above and is integrated with the main body 71. The main body 71 is formed in a rectangular shape as seen in a plan view. A bottom face of the main body 71 of each container 7 has recessed portions 74, which are recessed upward in the up-down direction Z, at three positions. The recessed portions 74 are formed in an upwardly tapered shape, and inner faces of the recessed portions 74 are inclined faces. These recessed portions 74 engage, from above, with the protruding pins 22P provided on the corresponding holder plate 22. When a container 7 is placed on a corresponding holder plate 22, even if the position of the container 7 is horizontally shifted relative to the holder plate 22, the relative position thereof is corrected to an appropriate correction due to an effect of the engagement between the inner faces of the recessed portions 74 and the protruding pins 22P.

Figure 5:
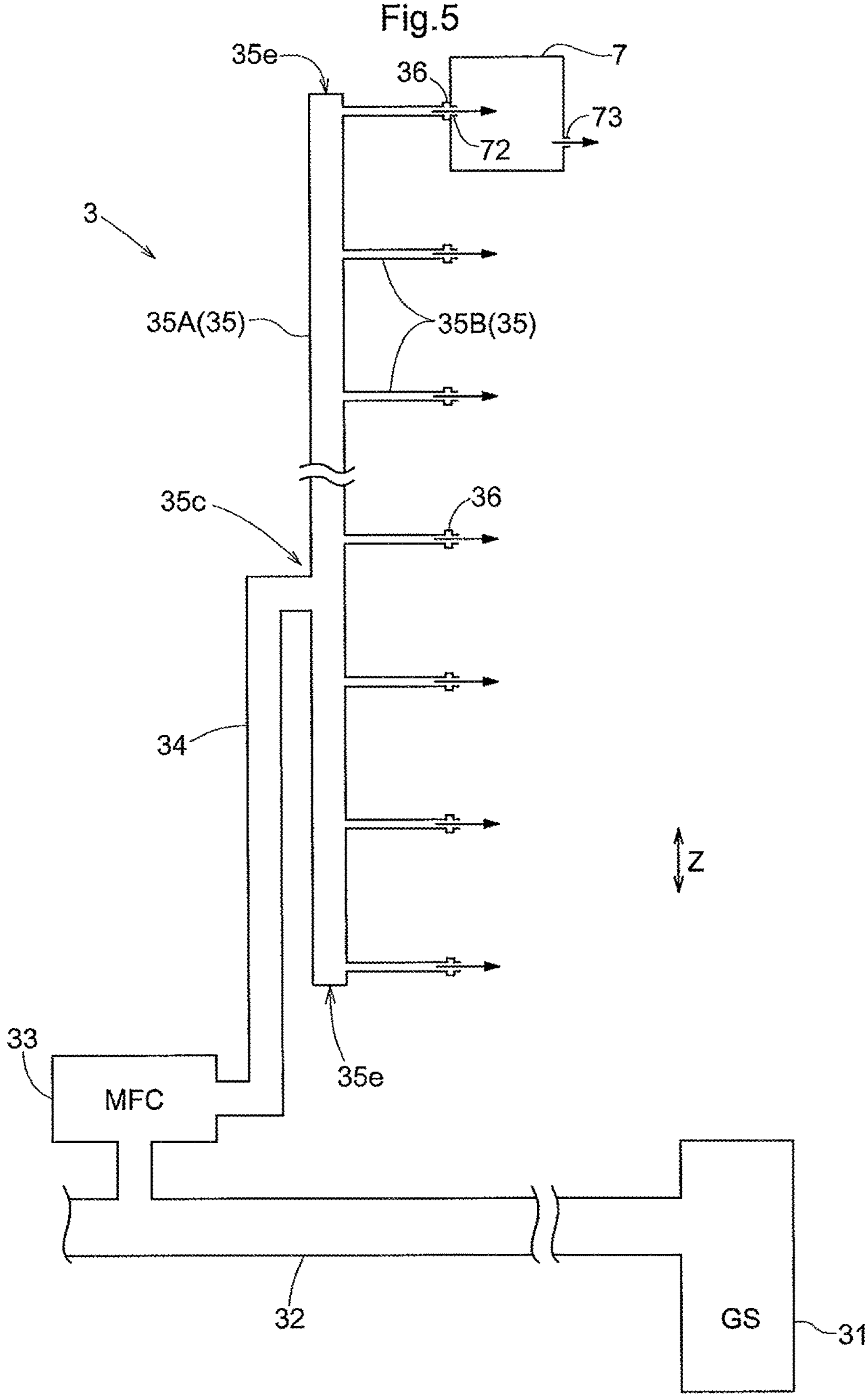
FIG. 5 is a schematic diagram of a flow path of a cleaning gas in the gas supply device.

As shown in FIG. 5, each container 7 is provided with an air charge port 72 and an exhaust port 73. Although the schematic diagram in FIG. 5 is intended to facilitate understanding and is therefore not accurate, in practice, both the air charge port 72 and the exhaust port 73 are formed on the bottom face of the container 7. A discharge nozzle 36 of a later-described gas supply device 3 is fitted to the air charge port 72.

The gas supply device 3 supplies cleaning gas to the respective storage sections S. When a container 7 is stored in each of the plurality of storage sections S, the gas supply device 3 supplies the cleaning gas into the stored containers 7. The plurality of storage sections S are grouped in accordance with a certain standard, and the gas supply device 3 according to this embodiment is configured to supply cleaning gas to each group (hereinafter referred to as "storage section groups G"). Note that, in this embodiment, each storage section group G is constituted by a group of storage sections S that belong to the same column, and the gas supply device 3 supplies cleaning gas to each column of the storage racks 2 (see FIG. 4). Thus, in this embodiment, the storage racks 2 each have a plurality of storage sections S in a state of being grouped into a plurality of storage section groups G, and the gas supply apparatus 3 is configured to supply cleaning gas to the storage sections S in units of the storage section groups G.

As shown in FIGS. 4 and 5, the gas supply device 3 includes a gas source (GS) 31, a parent pipe 32, flow rate adjustment units (MFC: Mass Flow Controller) 33, connecting pipes 34, and supply pipes 35. The gas source 31 is a tank for storing the cleaning gas, and is shared by a plurality of supply pipes 35. The cleaning gas is an inert gas such as nitrogen gas or argon gas, clean dry air from which dust and moisture have been removed, or the like. The flow rate adjustment units 33, the number of which corresponds to the number of storage section groups G (the number of columns of the storage racks 2), are connected to the gas source 31 via the parent pipe 32. The flow rate adjustment units 33 each include a flow rate sensor for measuring the flow rate of the cleaning gas, a flow rate adjustment valve for changing and adjusting the flow rate of the cleaning gas, and an internal control unit for controlling operations of this flow rate adjustment valve. The flow rate adjustment valve 33 controls the operations of the flow rate adjustment valve based on the result of detection by the flow rate sensor, and adjusts the flow rate of the cleaning gas so as to achieve a predetermined target flow rate.

The plurality of flow rate adjustment units 33 are each connected to the discharge nozzles 36, which are installed on the holder plates 22 constituting the storage sections S that belong to the corresponding storage section group G, via the connecting pipe 34 and the supply pipe 35. In this embodiment, the supply pipes 35 are of a branch-type. The supply pipes 35 each include one main pipe 35A for each storage section group G, and a plurality of branch pipes 35B that branch from the main pipe 35A. In this embodiment, the same number of branch pipes 35B as the number of levels of the storage racks 2 branch from the main pipe 35A. The discharge nozzle 36 is provided at a leading end of each branch pipe 35B, and the cleaning gas is discharged from this discharge nozzle 36. The gas supply device 3 thus supplies the cleaning gas to the storage sections S in units of the storage section group G from the gas source 31 via the branch-type supply pipes 35 that have the branch pipes 35B.

As mentioned above, the discharge nozzle 36 is fitted to the air charge port 72 of the container 7 stored in each storage section S. An air charge on-off valve (not shown) is provided in the air charge port 72 of each container 7. The air charge on-off valve is biased to a closed state by a biasing body, such as a spring. Upon the cleaning gas being discharged from the discharge nozzle 36 in a state of being fitted to the air charge port 72, the air charge on-off valve is opened by the pressure of the discharged cleaning gas, and the cleaning gas is supplied into the container 7 from the air charge port 72. Also, an exhaust on-off valve (not shown) is provided in the exhaust port 73 of each container 7. The exhaust on-off valve is also biased to a closed state by a biasing body, such as a spring. Upon the internal pressure of the container 7 increasing when a predetermined amount of cleaning gas has been supplied, the exhaust on-off valve opens due to this pressure, and the cleaning gas in the container 7 is discharged from the exhaust port 73.

Here, the value of ventilation resistance (pressure loss) when the cleaning gas flows through the containers 7 is not uniformly determined, and may differ depending on the container 7. Specifically, if, for example, containers 7 made by different manufacturers are mixed, the value of ventilation resistance when the cleaning gas flows through the containers 7 may differ depending on the manufacturer. Even in the case of the same manufacturer, if, for example, containers 7 of different models are mixed, similarly, the value of ventilation resistance when the cleaning gas flows through the containers 7 may also differ. In view of this point, in this embodiment, the containers 7 are classified into a plurality of types in accordance with the value of ventilation resistance when the cleaning gas flows through the containers 7. From the viewpoint of simplifying classification, it is favorable that the containers 7 are classified into a plurality of types in accordance with at least one of the manufacturer and the model thereof. In this embodiment, as an example, the containers 7 are classified into a plurality of types in accordance with only the manufacturer thereof.

Although the storage racks 2 have a plurality of storage sections S, the containers 7 are not always stored in all storage sections S. The discharge nozzle 36 provided in each storage section S is open in a state where no container 7 is stored therein and the discharge nozzle 36 is not connected to the air charge port 72 of a container 7, and the cleaning gas flows out from the discharge nozzle 36 (see FIG. 5).

Returning to the description of the gas supply device 3, in this embodiment, each connecting pipe 34, which is provided on the downstream side of the flow rate adjustment unit 33, is connected to an intermediate portion (more specifically, a position shifted from an intermediate point to one end side) of the main pipe 35A of the corresponding supply pipe 35. Each supply pipe 35 (specifically, the main pipe 35A) is connected, at a connecting portion 35*c*, to the gas source 31 via the connecting pipe 34, the flow rate adjustment unit 33, and the parent pipe 32. Each supply pipe 35 includes a connecting area Rc, which includes a connecting portion 35*c*, and two end areas Re, which are located on the downstream sides of the connecting area Rc in a gas flow direction (proximal end area Rep and distal end area Red) (see FIG. 7). The proximal end area Rep is one of the two end areas Re in a piping portion in which the flow path length from the connecting portion 35*c* is relatively short, and the distal end area Red is the end area Re in a piping portion in which the flow path length from the connecting portion 35*c* is relatively long. The proximal end area Rep and the distal end area Red each include a downstream end 35*e*. Note that the connecting area Rc, the proximal end area Rep, and the distal end area Red may be areas having a length that is 5% to 40% of the overall length of the main pipe 35A of each supply pipe 35, for example.

In this embodiment, each supply pipe 35 also includes an intermediate area Rm between the connecting area Rc and the distal end area Red. This intermediate area Rm may be further segmented into a plurality of areas, or may be provided between the connecting area Rc and the proximal end area Rep.

The transport apparatus 4 transports the containers 7, which serve as articles, to the storage sections S. As shown in FIG. 1, the transport apparatus 4 according to this embodiment includes the overhead hoist vehicle 41, the conveyor 44, and the stacker crane 45. The overhead hoist vehicle 41 has a traveling body 42, which travels along the ceiling rail 95, and a transfer unit 43, which is supported by the traveling body 42 in a suspended manner. The transfer unit 43 transports a container 7 to and from the conveyor 44 while holding the flange portion 76 provided in an upper portion of the container 7. The conveyor 44 is of a roller type or a belt type, for example, and moves the containers 7 between the internal space and the external space of the partition walls 97.

The stacker crane 45 has a traveling truck 46, which travels along the traveling rail 94 (in the left-right direction Y), masts 47, which are installed upright on the traveling truck 46, and a lift body 48, which moves up and down in a state of being guided by these masts 47. A transfer apparatus 49 for transferring the containers 7 between the storage sections S is provided on the lift body 48. The transfer apparatus 49 is constituted by a fork or the like that moves in and out in the front-rear direction X, for example.

The control unit 5 (CU) controls operations of the transport apparatus 4. As shown in FIG. 6, the control unit 5 individually controls operations of the overhead hoist vehicle 41 (OHV), the conveyor 44 (CV), and the stacker crane 45 (SC), which constitute the transport apparatus 4. The control unit 5 according to this embodiment individually controls operations of the flow rate adjustment units 33 (which are denoted as MFC1, MFC2, MFC3, . . . in FIG. 6), which are provided for the respective storage section groups G in one-to-one correspondence. The control unit 5 according to this embodiment determines the type of each container 7 based on various kinds of information, which is obtained using a later-described information acquiring means. Thus, the control unit 5 according to this embodiment includes a transport control unit, a flow rate control unit, and a type discrimination unit.

To sufficiently clean the inside of all containers 7 stored in the storage sections S, it is favorable to make the flow rate of the cleaning gas to be supplied to the storage sections S as uniform as possible. To solve this issue, it is also conceivable to provide a flow rate adjustment unit 33 for each storage section S in one-to-one correspondence. However, a flow rate adjustment unit 33 is usually expensive. Accordingly, if the same number of flow rate adjustment units 33 as the storage sections S is provided, the manufacturing cost of the container storage facility 1 will greatly increase. In particular, in the case where the container storage facility 1 is for storing containers 7 which are small reticle pods and is likely to have a very high number of holders (storage sections 5) in the storage racks 2, the manufacturing cost will significantly increase. For this reason, this embodiment employs a configuration in which one flow rate adjustment unit 33 is provided for each storage section group G, which is set corresponding to each column of the storage racks 2, and the flow rate of the cleaning gas supplied to the storage sections S that belong to one storage section group G is collectively controlled by a single flow rate adjustment unit 33.

Of course it is difficult to finely adjust the flow rate for each storage section S with only one flow rate adjustment unit 33 for each storage section group G. For example, as mentioned above, the value of ventilation resistance when the cleaning gas flows through the containers 7 may differ depending on the container 7. Furthermore, research by the inventors has revealed that how smoothly the cleaning gas supplied from each flow rate adjustment unit 33 flows through the corresponding supply pipe 35 is not always uniform throughout the entire area of this supply pipe 35, and differs depending on the position in the supply pipe 35. For this reason, the flow rate of the cleaning gas from one supply pipe 35 (flow rate adjustment unit 33) is not necessarily uniform in all storage sections S that belong to the same storage section group G, and differs depending on the position of the storage sections S relative to the piping route of the supply pipe 35.

Figure 7:
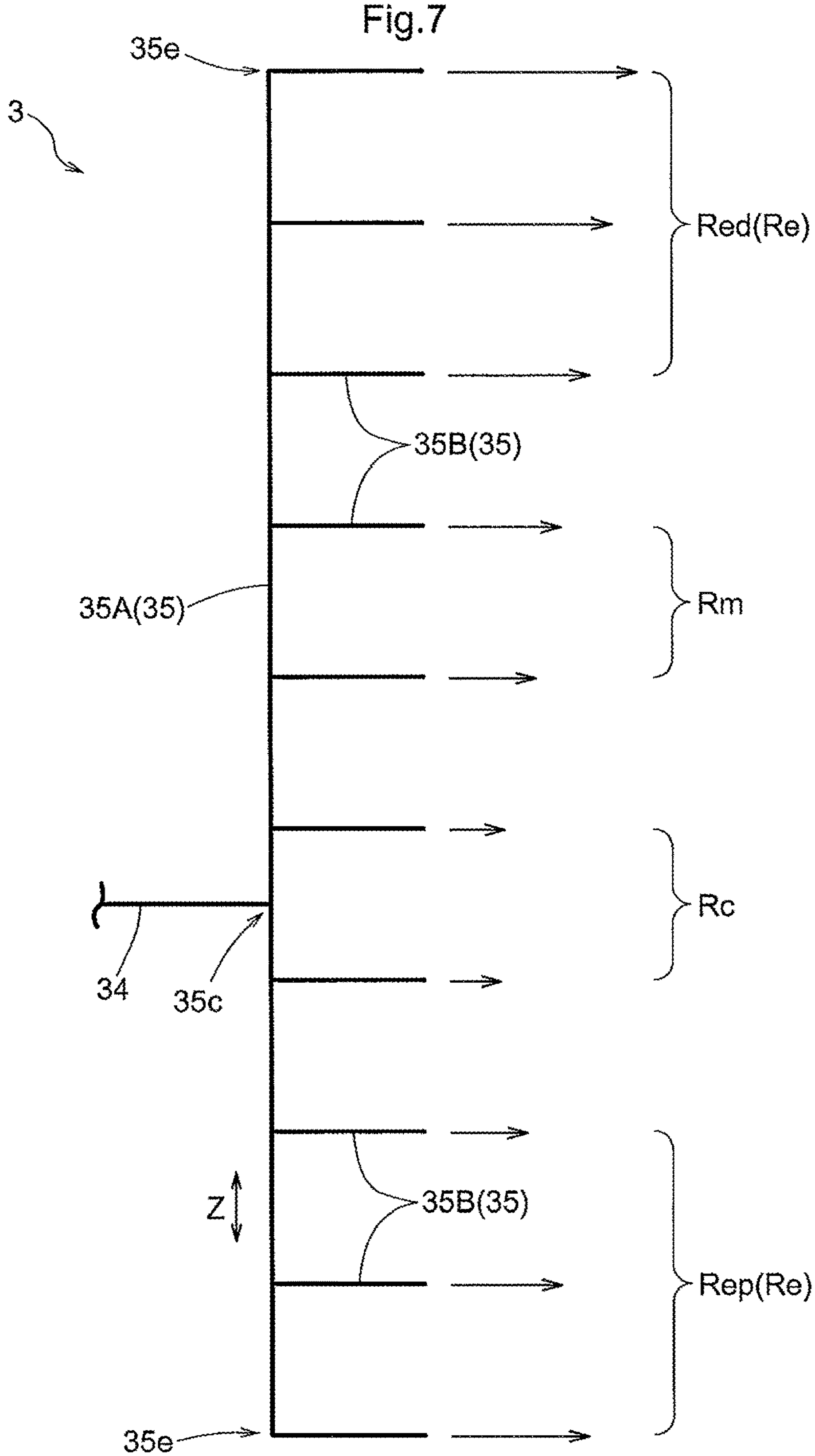
FIG. 7 is a schematic diagram showing a distribution of the flow rate of the cleaning gas from respective branch pipes of a supply pipe.

For example, the flow rate of the cleaning gas (the amount of discharged cleaning gas) at the storage sections S corresponding to the connecting area Rc of the supply pipe 35 with no container 7 stored in the storage section group G of interest as schematically shown in FIG. 7 is smaller than the flow rate of the cleaning gas at the storage sections S corresponding to the end areas Re. Furthermore, the flow rate of the cleaning gas at the storage sections S corresponding to the proximal end area Rep, of the two end areas Re, is smaller than the flow rate of the cleaning gas at the storage sections S corresponding to the distal end areas Red. Note that FIG. 7 qualitatively shows the relationship regarding the flow rate of the cleaning gas, through the length of arrows assigned to the respective branch pipes 35B of the supply pipe 35.

In the configuration in which one flow rate adjustment unit 33 is provided for each storage section group G, it is also conceivable to form an orifice (an example of a fluid resistor) for each storage section S, for example, to absorb a difference in the ventilation resistance among the containers 7 and a difference in the flow rate of the cleaning gas depending on the position of the storage section S. However, forming a very small orifice so as to have a desired inner diameter requires high processing accuracy. Furthermore, in the case of the container storage facility 1 that is likely to have a huge number of holders in the storage racks 2 (the number of storage sections 5), as is the case with this embodiment, it is not realistic in terms of manufacturing costs to accurately form a large number of orifices with many different inner diameters. When restrictions on costs are also given consideration, the processing accuracy needs to be reduced to some degree, and accordingly, there is a limit to making the flow rate of the cleaning gas uniform by forming orifices.

For this reason, in this embodiment, operations of the transport apparatus 4 are controlled so that a difference in the ventilation resistance among the containers 7 and a difference in the flow rate of the cleaning gas depending on the position of the storage section S are not likely to have an effect, when the containers 7 are stored in the storage racks 2. In other words, an increase in costs due to forming a large number of accurately processed orifices is avoided, and the flow rate of the cleaning gas supplied to the storage sections S is made as uniform as possible only by controlling the operations of the transport apparatus 4.

Figure 8:
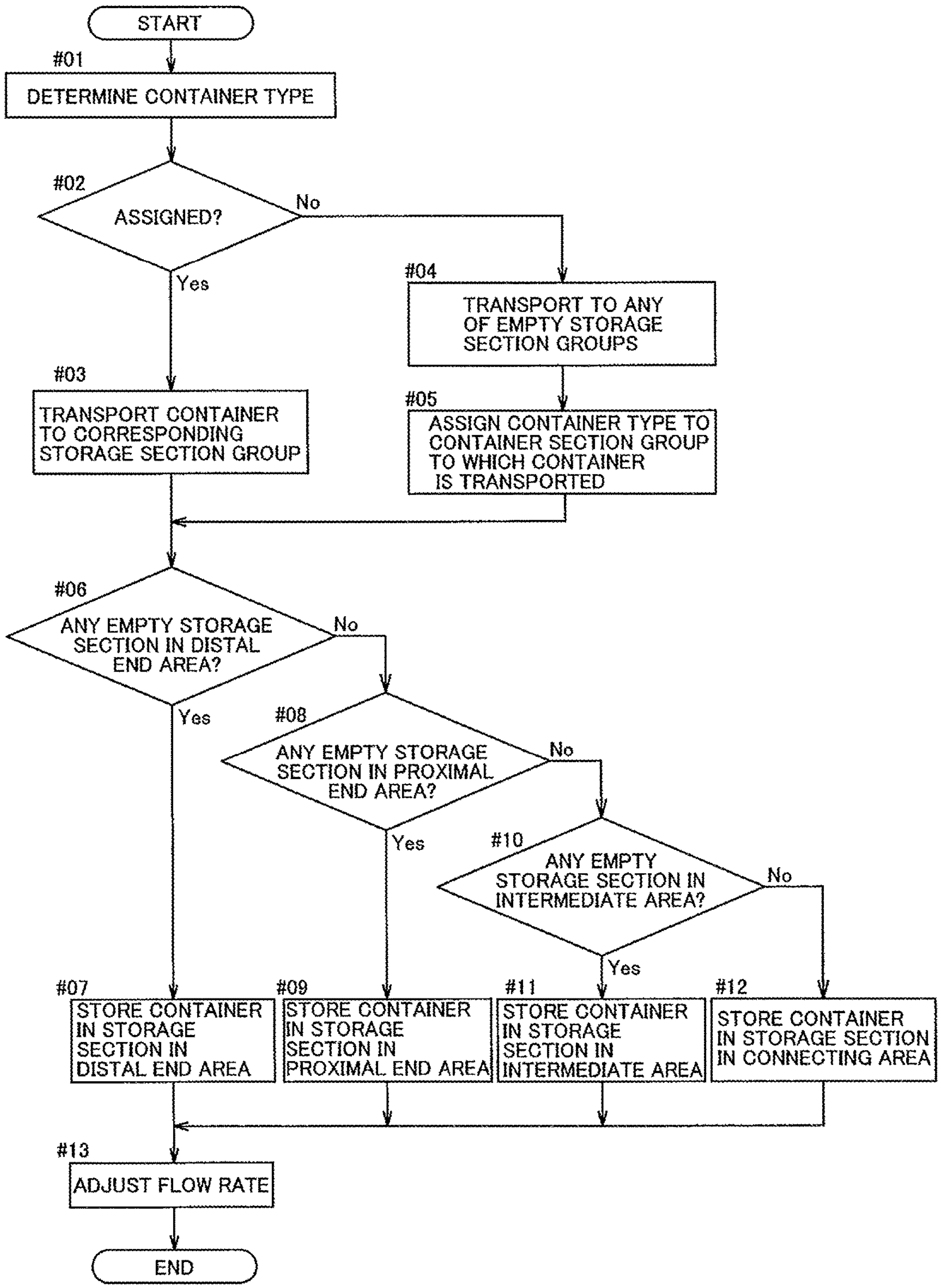
FIG. 8 is a flowchart of an article storage control processing procedure.

A description will be given below, with reference to FIG. 8, of article storage control for making the flow rate of the cleaning gas uniform. In the article storage control, the control unit 5 controls operations of the transport apparatus 4 based on roughly two viewpoints. The first viewpoint is to eliminate, as much as possible, the influence of a difference in the ventilation resistance among the containers 7. The second view point is to eliminate, as much as possible, the influence of a difference in the flow rate of the cleaning gas depending on the position of the storage section S in the respective storage section groups G.

When storing a plurality of containers 7 in the storage sections S, the control unit 5 controls, based on the first aspect, the operations of the transport apparatus 4 so as to transport containers 7 of the same type to storage sections S that belong to the same storage section group G. Upon a container 7 being brought in by the overhead hoist vehicle 41 and the conveyor 44, the type of this container 7 is determined (step #01). In this embodiment, an information acquiring means or device 6 for acquiring basic information regarding the type of each container 7 is installed in the container storage facility 1. For example, the information acquiring means or device 6 may be a reader for reading a barcode or an IC tag that is attached to each container 7, a camera for capturing the external appearance of each container, or the like. For example, the barcode or the IC tag indicates information regarding the manufacturer, the model, or the like of each container 7. The control unit 5 (type determination unit) may be configured to determine the container type based on the information regarding the manufacturer read by the information acquiring means or device 6 that is constituted by a reader. Otherwise, a configuration may also be employed in which a plurality of template images of the external appearance of containers 7 from each manufacturer are set in advance, and the control unit 5 determines the container type based on image recognition processing (matching processing) using the template images and captured images obtained by the information acquiring means or device 6 that is constituted by a camera.

After the type of the container 7 has been determined, whether or not other containers 7 of the same type are already stored in any of the storage sections S is determined. In other words, whether or not a storage section group G has already been assigned to the containers 7 of this type is determined (#02). If a storage section group G has already been assigned (#02: Yes), the container 7 is transported to this storage section group G (#03). On the other hand, if no storage section group G has been assigned, i.e. if no containers 7 of the same type as this container 7 have been stored (#02: No), the container 7 is transported to any one of empty storage section groups G (#04). Then, the storage section group G to which the container 7 is transported is set as the storage destination of other containers 7 of the same type as this container 7 (#05).

After the storage section group G to which the container 7 is to be transported has been determined in the processing in steps #01 to #05, next, the storage section S in this storage section group G to which the container 7 is to be stored is determined. In this embodiment, the control unit 5 controls, for each storage section group G, the operations of the transport apparatus 4, when first storing a container 7 in a state where no container 7 is stored in any of the storage sections S included in this storage section group G, so as to transport the container 7 to a storage section S to which the cleaning gas is supplied from the end areas Re of the supply pipe 35, based on the aforementioned second viewpoint. At this time, the control unit 5 controls the operations of the transport apparatus 4 so as to first transport the container 7 to a storage section S to which the cleaning gas is supplied from the end area Re (distal end area Red) in a piping portion having a relatively longer flow path length from the connecting portion 35*c*, of the two end areas Re.

Specifically, it is first determined whether or not there are any storage sections S in which no container 7 is stored in the plurality of storage sections S that are associated with the distal end area Red of the supply pipe 35 (#06). For example, the state of each storage section S as to whether a container 7 is stored therein may be determined based on the result of detection by a load sensor that is installed on each holder plate 22, or may be determined based on management information that is acquired from a superior control apparatus that comprehensively governs the entire container storage facility 1.

Figure 9:
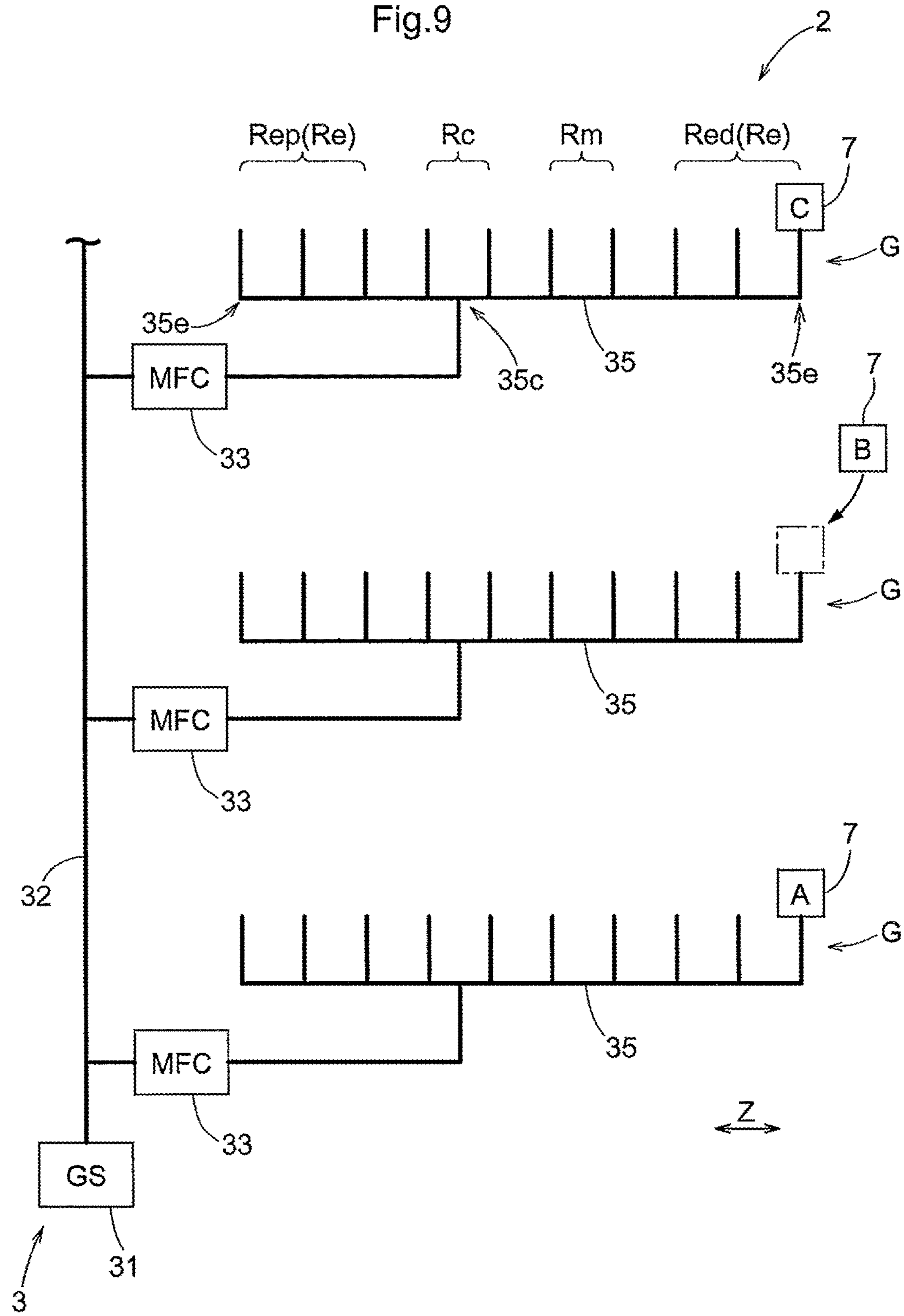
FIG. 9 is a schematic diagram showing a phase in article storage control.

If the determination result is that there are storage sections S in which no container 7 is stored (#06: Yes), the container 7 is stored in any one of the storage sections S that are associated with the distal end area Red and in which no container 7 is stored (#07). When storing the container 7 in any one of the storage sections S that are associated with the distal end area Red, it is favorable that the control unit 5 controls the operations of the transport apparatus 4 so as to preferentially transport the container 7 to a storage section S to which the cleaning gas is supplied from the downstream end 35*e* (see FIG. 7) of the supply pipe 35. For example, if, at this point in time, no container 7 is stored in a storage section S to which the cleaning gas is supplied from the downstream end 35*e* of the supply pipe 35, it is favorable to transport the container 7 to this storage section S that is associated with the downstream end 35*e* (see FIG. 9). If a container 7 has already been stored in the storage section S that is associated with the downstream end 35*e*, it is favorable to transport the container 7 to the most downstream one of the storage sections S in which no container 7 is stored.

Figure 10:
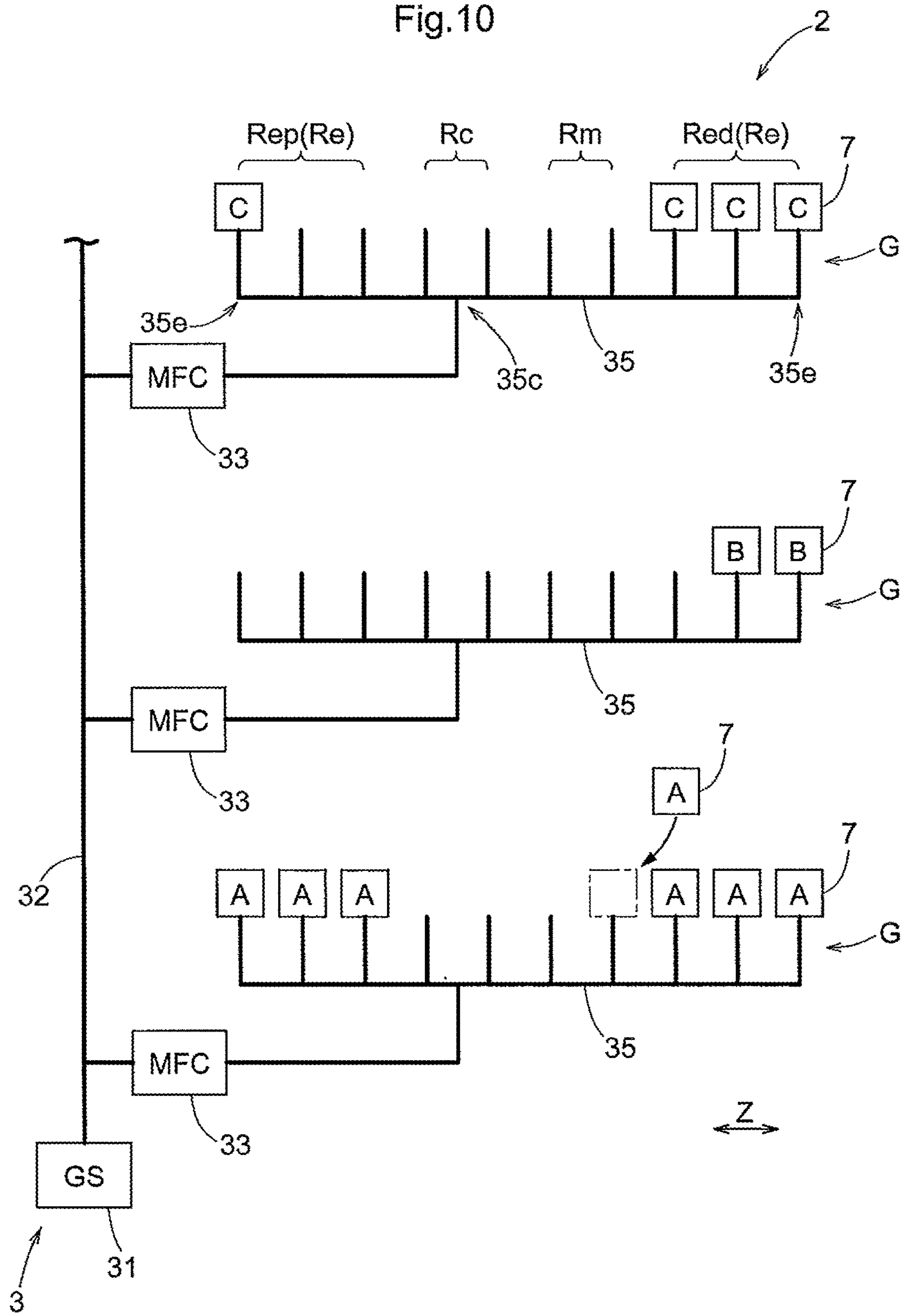
FIG. 10 is a schematic diagram showing a phase in article storage control.

If containers 7 are already stored in all storage sections S that are associated with the distal end area Red (#06: No), the control unit 5 controls the operations of the transport apparatus 4 so as to preferentially transport the container 7 to a storage section S that is associated with an area at a position closer to the downstream ends 35*e* (i.e. at a position farther from the connecting portion 35*c*). In this embodiment, the control unit 5 preferentially transports containers 7 to storage sections S that are associated with areas in order from the proximal end area Rep to the intermediate area Rm and then to the connecting area Rc of the supply pipe 35 (see FIG. 10). In other words, the control unit 5 controls the operations of the transport apparatus 4 so as to subordinately transport containers 7 to the storage sections S to which the cleaning gas is supplied from the connecting area Rc of the supply pipe 35. Note that "subordinately" refers to a concept that is the opposite of "preferentially", and means to delay the order.

Specifically, it is determined whether or not there are any storage section S in which no container 7 is stored in the plurality of storage sections S that are associated with the proximal end area Rep of the supply pipe 35 (#08). If any storage sections S in which no container 7 is stored are present (#08: Yes), the container 7 is stored in any one of the storage sections S that are associated with the proximal end area Rep and in which no container 7 is stored (#09). When storing the container 7 in any one of the storage sections S that are associated with the proximal end area Rep, it is favorable that the control unit 5 controls the operations of the transport apparatus 4 so as to preferentially transport the container 7 to a storage section S to which the cleaning gas is supplied from the downstream end 35*e* of the supply pipe 35. This point can be considered as being similar to that of the operation control for the distal end area Red.

If containers 7 have already been stored in all storage sections S that are associated with the proximal end area Rep (#08: No), next, it is determined whether or not there are any storage sections S in which no container 7 is stored in the plurality of storage sections S that are associated with the intermediate area Rm of the supply pipe 35 (#10). If any storage sections S in which no container 7 is stored are present (#10: Yes), the container 7 is stored in any one of the storage sections S that are associated with the intermediate area Rm and in which no container 7 is stored (#11). When storing the container 7 in any one of the storage sections S that are associated with the intermediate area Rm, it is favorable to preferentially transport the container 7 to the most downstream one of the storage sections S in which no container 7 is stored.

If containers 7 have already been stored in all storage sections S that are associated with the intermediate area Rm (#10: No), the container 7 is stored in any one of the storage sections S that are associated with the connecting area Rc and in which no container 7 is stored (#12). When storing the container 7 in any one of the storage sections S that are associated with the connecting area Rc, it is favorable to preferentially transport the container 7 to the most downstream one of the storage sections S in which no container 7 has been stored.

Thus, the control unit 5 according to this embodiment controls the operations of the transport apparatus 4 so as to transport containers 7 of the same type to storage sections S that belong to the same storage section group G (#01 to #05). In this manner, containers 7 with a similar value of ventilation resistance when the cleaning gas flows therethrough are transported to storage sections S that belong to the same storage section group G. That is to say, a plurality of containers 7 are categorized based on the ventilation resistance value into groups of containers 7 with similar ventilation resistance values, and the respective groups are collectively stored in any of the storage section group G (see FIG. 10). Accordingly, the flow rate of the cleaning gas that is actually supplied to a plurality of containers 7 stored in storage sections S that belong to the same storage section group G can be made as uniform as possible. Note that, in FIG. 10, capital alphabetic characters that appear in the containers 7 indicate manufacturers (company A, company B, company C etc.).

The control unit 5 according to this embodiment controls the operations of the transport apparatus 4 so as to preferentially transport containers 7 to the storage sections S that are associated with the end areas Re (distal end area Red) of the supply pipe 35, and to subordinately transport containers 7 to storage sections S that are associated with the connecting area Rc (#06 to #12). In this manner, containers 7 are stored in order from storage sections S in which the flow rate of the supplied cleaning gas is relatively high in a state where no container 7 is stored, to storage sections S in which the flow rate of the supplied cleaning gas is relatively low. In this case, in a state where the number of stored containers 7 is relatively small, the discharge nozzles 36 are preferentially fitted to the air charge ports 72 of the containers 7 in the storage sections S through which the cleaning gas can smoothly flow, and mainly the discharge nozzles 36 of the storage sections S through which the cleaning gas cannot smoothly flow are in an open state. For this reason, the amount of cleaning gas discharged from the storage sections S in which no container 7 is stored can be kept small. Accordingly, cleaning gas at a flow rate close to a target flow rate can be appropriately supplied to the actually stored containers 7. By repeating similar control, cleaning gas at a flow rate close to a target flow rate can be appropriately supplied to the actually stored containers 7 on every occasion. As a result, the flow rate of the cleaning gas supplied to the storage sections S via the branch-type supply pipe 35 can be made as uniform as possible.

After the container 7 to be transported is stored in a specific storage section S that belongs to a specific storage section group G as described above, the flow rate of the cleaning gas is adjusted by the flow rate adjustment unit 33 that is provided in association with this storage section group G (#13). The flow rate adjustment unit 33 adjusts the flow rate of the cleaning gas in accordance with the number and the type of containers 7 that are stored in this storage section group G, for example. For example, the flow rate adjustment unit 33 adjusts the flow rate of the cleaning gas so as to achieve a target flow rate, which is calculated by multiplying a reference flow rate that is set for each type of container 7 by the number of containers 7 stored and a correction coefficient, which increases as the number of containers 7 stored decreases.

The above processing is repeatedly executed every time a container 7 is brought in. In this case, actual processing to transport a container 7 to a specific storage section S in a specific storage section group G (#06 to #12) and processing to determine a storage section group G to which a container 7 that is brought in next is to be transported (#01 to #05) may be executed in parallel.

Second Embodiment

The second embodiment of a container storage facility will be described with reference to the drawings. The container storage facility 1 according to this embodiment is different from the above-described first embodiment in a specific configuration of the storage racks 2. Accordingly, the content of specific processing for article storage control to make the flow rate of the cleaning gas uniform is also partially different from the above-described first embodiment. The container storage facility 1 according to this embodiment will be described below, mainly regarding differences from the first embodiment. Note that features that are not specifically described are similar to those in the first embodiment, and are assigned the same signs and not described in detail.

Figure 11:
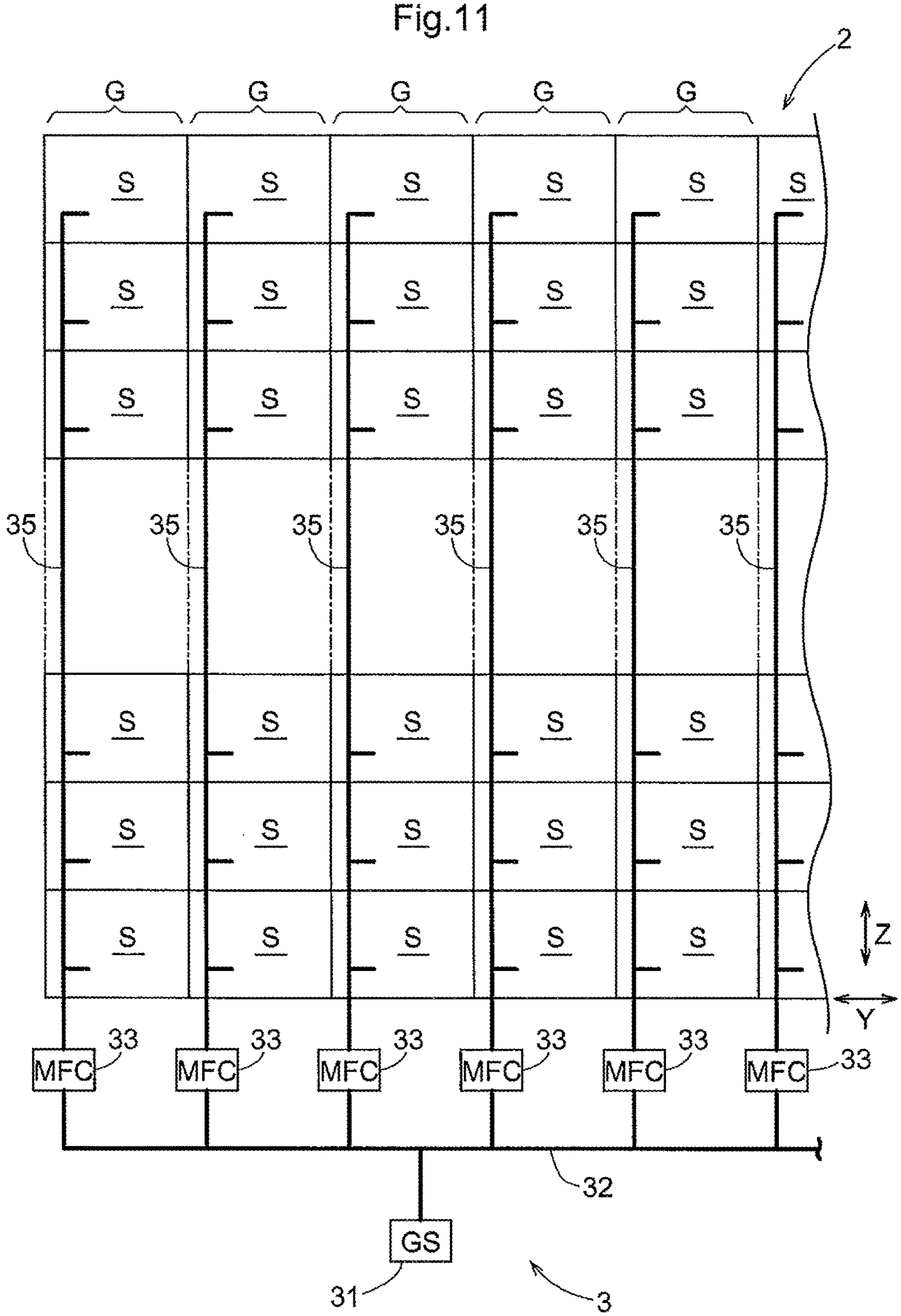
FIG. 11 is a schematic diagram of a storage rack and a gas supply device according to a second embodiment.

In this embodiment, as shown in FIG. 11, the number of levels of the storage sections S (holder plates 22) provided in each of the storage racks 2 is not the same among all columns (storage section groups G), and the number of levels in some columns is different from the number of levels in the other columns. For example, some of the holder plates 22 are configured not to be fixed to the support columns in some columns of the storage racks 2, which are similar to those in the first embodiment. Thus, the number of levels in some columns is smaller than the number of levels in other columns. Here, the number of levels (number of storage sections 5) in a portion that maintains the same structure as that of the storage racks 2 in the first embodiment is defined as a "reference number". A storage section group G to which the reference number of storage sections S belong will be referred to as a "normal storage section group Gn" in this embodiment. Meanwhile, a storage section group G in which some holder plates 22 are not fixed and to which a smaller number of storage sections S than the reference number belong will be referred to as a "special storage section group Gs" in this embodiment. The storage racks 2 in this embodiment each have both the normal storage section group Gn and the special storage section group Gs as the storage section groups G. Note that the positions of the connecting area Rc, the intermediate area Rm, and the end areas Re of the supply pipe 35 may be slightly shifted between the normal storage section group Gn and the special storage section Gs (see FIG. 12).

In this embodiment, the containers 7 are categorized into a plurality of types based on both the manufacturer and the model thereof, according to the combination of the manufacturer and the model. By categorizing the containers 7 into types according to the combination of the manufacturer and the model, the containers 7 can be categorized in accordance with the value of ventilation resistance when the cleaning gas flows through the containers 7, relatively precisely with a relatively simple method. In containers 7 of a specific model made by a specific manufacturer, the ventilation resistance when the cleaning gas flows therethrough may be significantly higher than the ventilation resistance in other containers 7. The containers 7 having such a significant ventilation resistance (a ventilation resistance greater than a predetermined reference resistance value) can be extracted simultaneously when the container type is determined by the control unit 5 (type determination unit).

In this embodiment, the control unit 5 controls operations of the transport apparatus 4 so as to transport a container 7 with a ventilation resistance greater than the predetermined reference resistance value to a storage section S that belongs to the special storage section group Gs. The number of branches of the supply pipe 35 that lead to the storage sections S in the special storage section group Gs is smaller than the number of branches of the supply pipe 35 that lead to the storage sections S in the normal storage section group Gn. Accordingly, the flow rate of the cleaning gas supplied to the storage sections S in the special storage section group Gs can be increased without any significant adjustment of the flow rate of the supplied cleaning gas. As a result, the inside of the containers 7 with a large ventilation resistance can also be appropriately cleaned by performing a simple control to store these containers 7 in the storage sections S in the special storage section group Gs.

Figure 12:
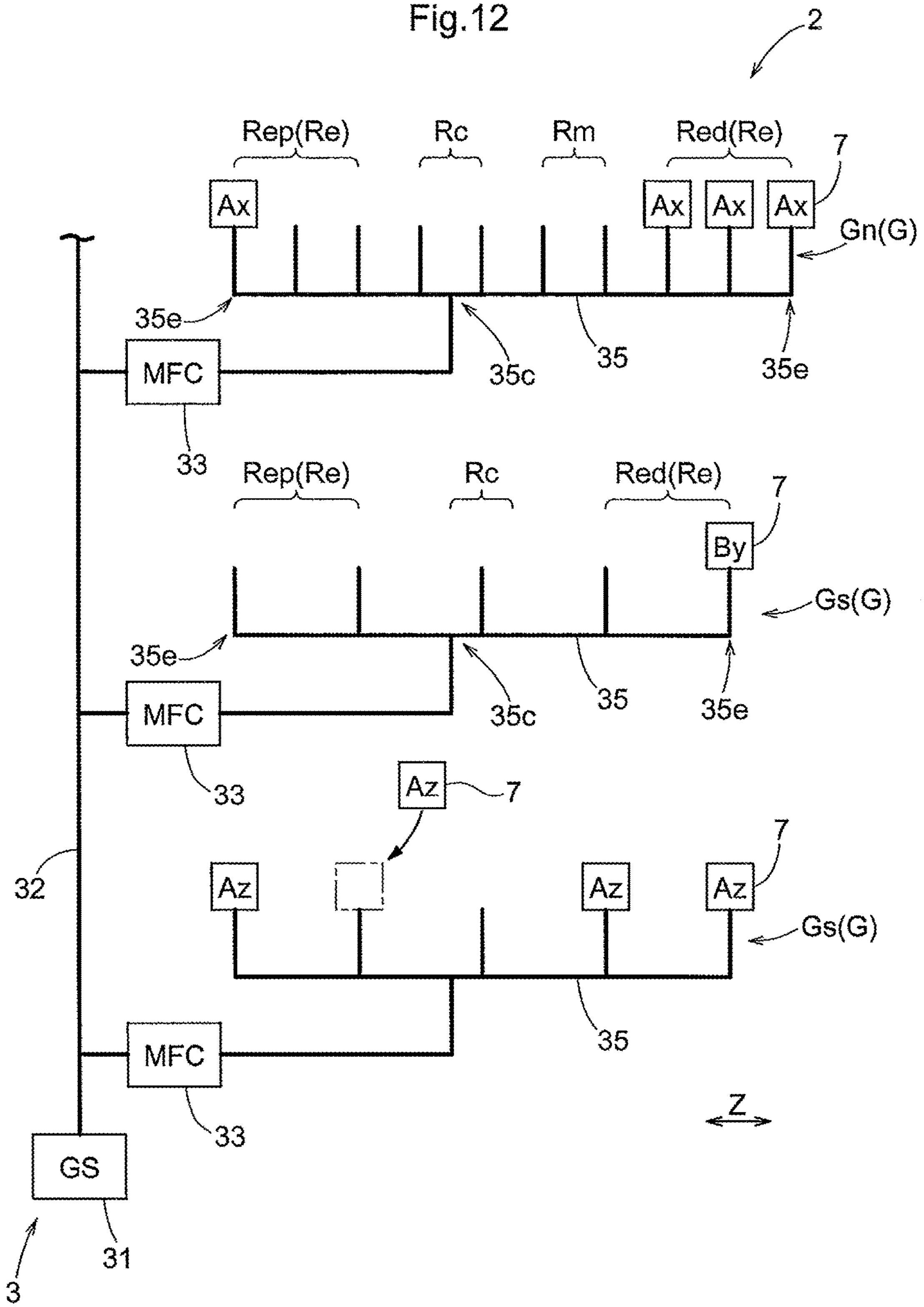
FIG. 12 is a schematic diagram showing a situation in article storage control.

In this embodiment as well, the control unit 5 controls operations of the transport apparatus 4 so as to transport containers 7 of the same type to storage sections S that belong to the same storage section group G (normal storage section group Gn or special storage section group Gs) (see FIG. 12). Thus, the flow rate of actually supplied cleaning gas can be made as uniform as possible among a plurality of containers 7 stored in storage sections S that belong to the same storage section group G, while also appropriately purging the inside of containers 7 having a large ventilation resistance, by performing a simple control. Note that, in FIG. 12, capital alphabetic characters denoted in the containers 7 indicate manufacturers (company A, company B, company C . . . ), and lower case alphabetic characters indicate models (model x, model y, model z . . . ).

Figure 13:
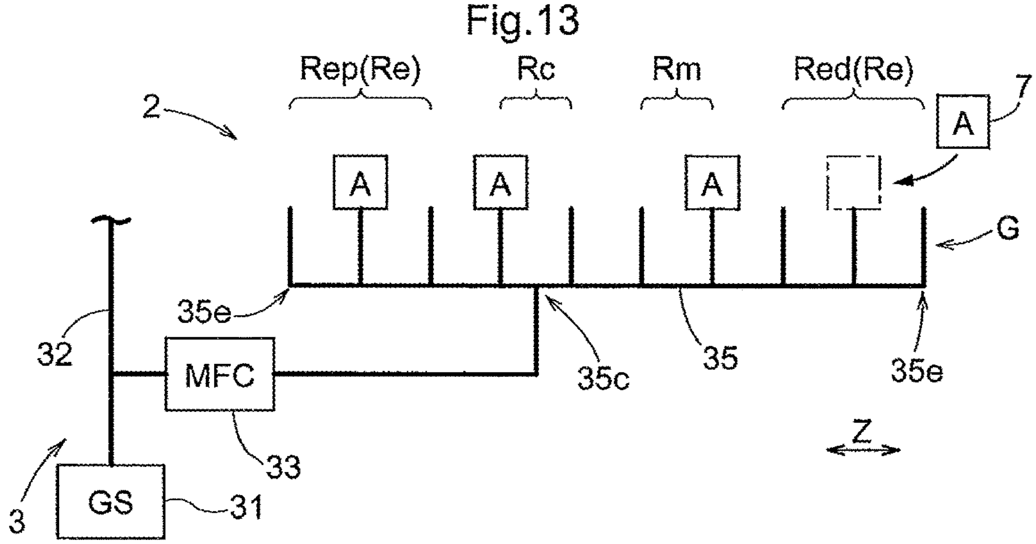
FIG. 13 is a schematic diagram showing a situation in article storage control in another mode.

Other Embodiments (1) The above embodiments have been described while taking, as an example, a configuration in which, when containers 7 are to be stored in the storage section groups G, the containers 7 are transported preferentially to the storage sections S that are associated with the end areas Re of the supply pipe 35, and subordinately to the storage sections S that are associated with the connecting area Rc. However, the present invention is not limited to this configuration. For example, as shown in FIG. 13, the containers 7 may be randomly transported to any of the storage sections S that belong to the storage section group G to which the containers 7 are transported, irrespective of the areas of the supply pipe 35.

Figure 14:
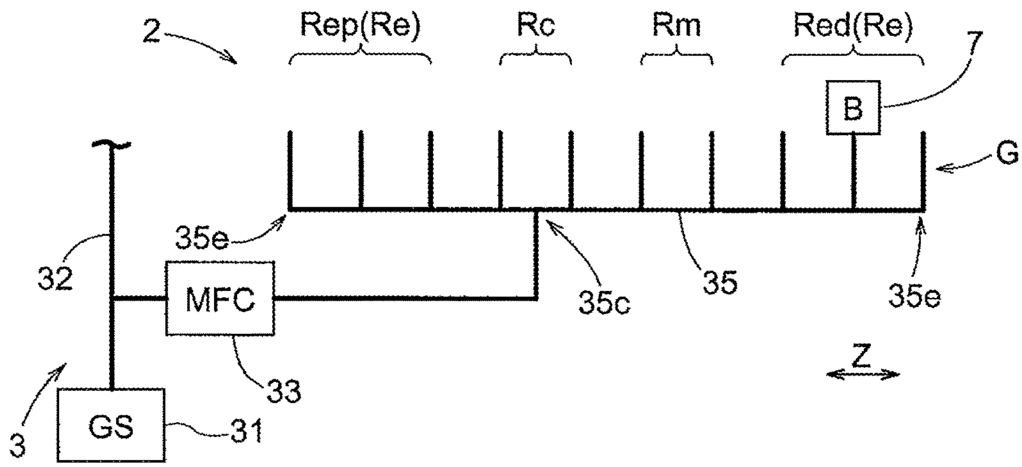
FIG. 14 is a schematic diagram showing a situation in article storage control in another mode.

(2) The above embodiments have been described, while assuming a configuration in which, when containers 7 are stored in storage sections S included in each storage section group G, a container 7 is first transported to the storage section S to which the cleaning gas is supplied from the downstream end 35*e* of the supply pipe 35. However, the present invention is not limited to this configuration. For example, as shown in FIG. 14, a container 7 may be first transported to a storage section S to which the cleaning gas is supplied from a branch pipe 35B in the end area Re that is provided at a position other than the downstream end 35*e*.

Figure 15:
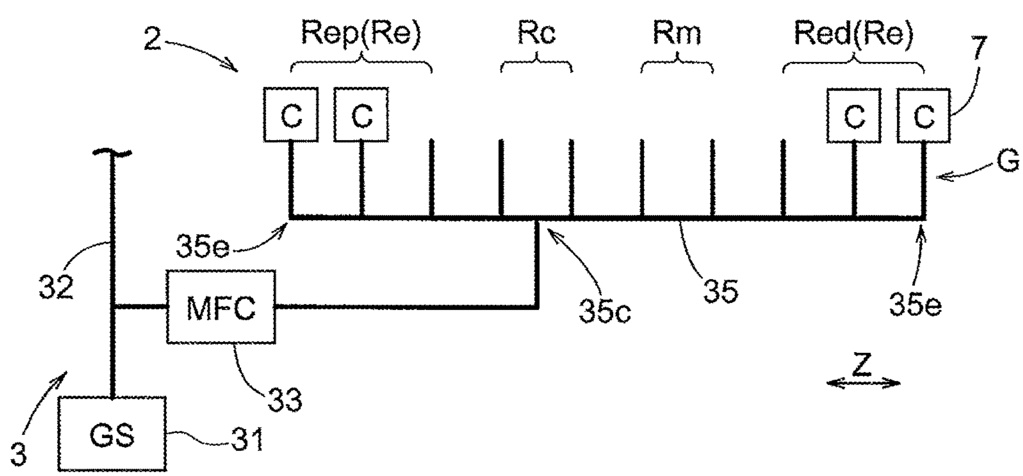
FIG. 15 is a schematic diagram showing a situation in article storage control in another mode.

(3) The first embodiment has been described while taking, as an example, a configuration in which containers 7 are preferentially transported to the storage sections S that are associated with the distal end area Red over the storage sections S that are associated with the proximal end area Rep. However, the present invention is not limited to this configuration. For example, as shown in FIG. 15, preference may not be given to the proximal end area Rep or the distal end area Red, and containers 7 may be appropriately assigned and transported to the storage sections S that are associated to those end areas.

(4) The above embodiments have been described while taking, as an example, a configuration in which container types are assigned posteriorly to the respective storage section groups G in order to reduce constraints regarding the storing positions for storing the containers 7 on the storage racks 2. However, the present invention is not limited to this configuration. A configuration may be employed in which the container types are assigned in advance to the respective storage section groups G, and when a container 7 is stored, this container 7 is transported to a storage section group G in accordance with the initial assignment even if no container 7 of the same type as this container 7 is stored.

(5) The above embodiments have been described while taking, as an example, a configuration in which the connecting pipe 34 is connected to an intermediate portion of the supply pipe 35, and the supply pipe 35 includes two end areas Re on both sides of the connecting area Rc. However, the present invention is not limited to this configuration. For example, a configuration may also be employed in which the supply pipe 35 is directly connected to the flow rate adjustment unit 33, and the supply pipe 35 includes only one end area Re on a downstream side of the connecting area Rc.

Figure 16:
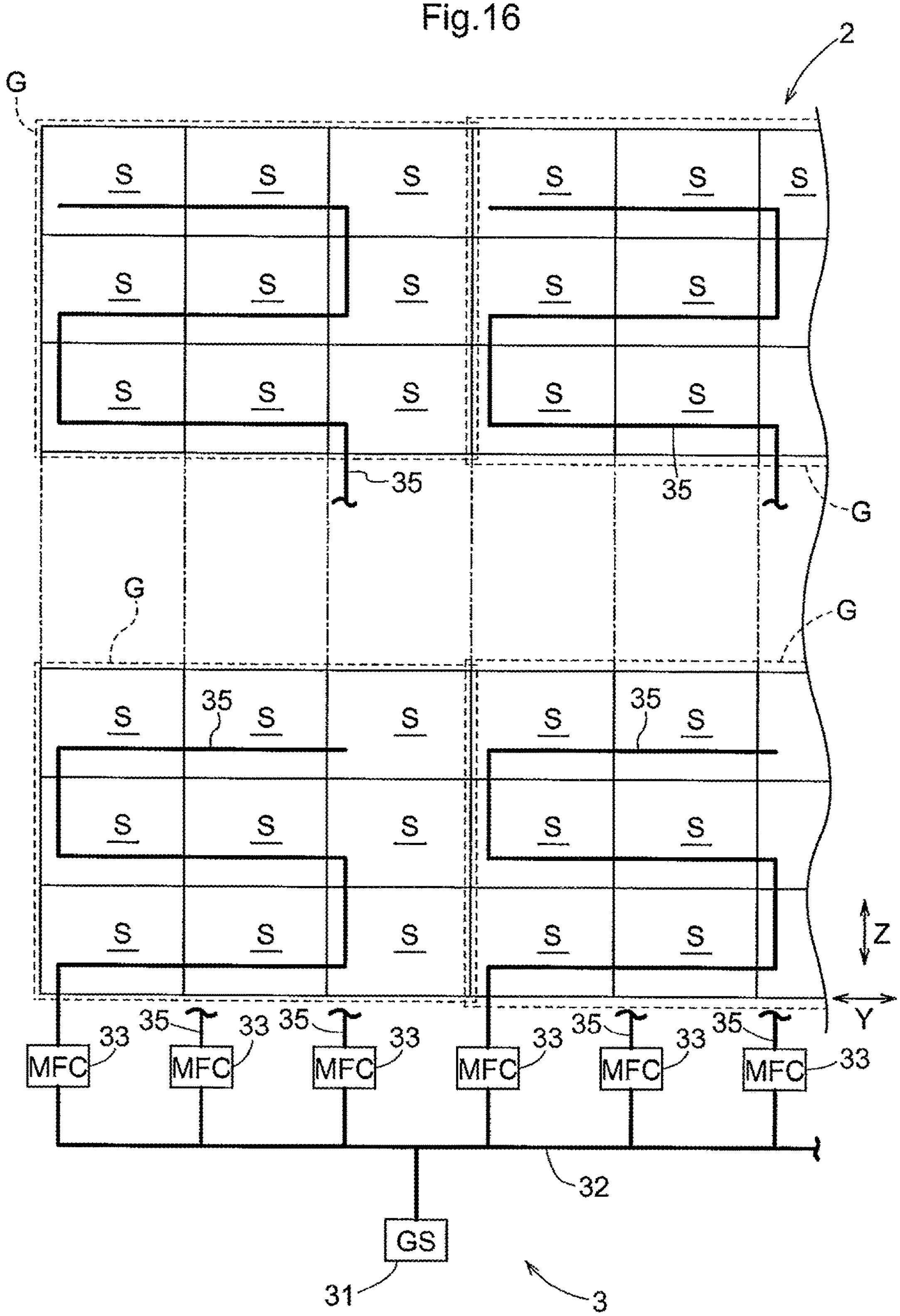
FIG. 16 is a schematic diagram of a storage rack and a gas supply device in another mode.

(6) The above embodiments have been described while taking, as an example, a configuration in which each storage section group G is constituted by a group of storage sections S that belong to the same column. However, the present invention is not limited to this configuration. Each storage section group G may be constituted by a group of storage sections S that belong to the same level. Otherwise, as shown in FIG. 16, each storage section group G may be constituted by a group of storage sections S that are arranged in a lattice pattern so as to form a plurality of levels and a plurality of columns. Otherwise, each storage section group G may be constituted by a group of storage sections S that are arranged so as to form various other shapes.

(7) The above embodiments have been described while taking, as an example, a configuration in which each of the containers 7 is a reticle pod for accommodating a reticle. However, the present invention is not limited to this configuration. For example, each of the containers 7 may be an FOUP (Front Opening Unified Pod) for accommodating a plurality of semiconductor wafers, or may be one for accommodating food, pharmaceutical articles, or the like.

(8) The configurations disclosed in the above-described embodiments (including the above embodiments and other embodiments; the same will also apply below) may be applied while being combined with configurations disclosed in other embodiments, provided there is no inconsistency. Regarding other configurations as well, the embodiments disclosed in this specification are examples in all aspects, and may be modified as appropriate without departing from the gist of this disclosure.

Overview of the Embodiments

A container storage facility according to this embodiment is a container storage facility including:

a storage rack having a plurality of storage sections in a state of being segmented into a plurality of storage section groups;

a gas supply device configured to supply a cleaning gas to the storage sections for each of the storage section groups;

a transport apparatus configured to transport containers to the storage sections; and a control unit configured to control operation of the transport apparatus, wherein the containers are categorized into a plurality of types according to a value of ventilation resistance when the cleaning gas flows through the containers, and when a plurality of containers are to be stored in the storage sections, the control unit controls the operation of the transport apparatus so as to transport containers of the same type to the storage sections that belong to the same storage section group.

With this configuration, containers with similar values of ventilation resistance when the cleaning gas flows therethrough are stored in the storage sections that belong to the same storage section group. That is to say, a plurality of containers are categorized by the value of ventilation resistance value into types of containers with similar values of ventilation resistance, and the respective types of containers are collectively stored in any of the storage section groups. Accordingly, the flow rate of actually supplied cleaning gas can be made as uniform as possible among a plurality of containers stored in storage sections that belong to the same storage section group.

It is preferable as one mode that, when a container is to be stored in one of the storage sections, if no container of the same type as the container to be stored is stored, the control unit controls the operation of the transport apparatus so as to transport the container to one of the storage sections that belong to an empty one of the storage section groups in which no container is stored in any of the storage sections, and sets the storage section group to which the storage section to which the container to be stored is transported belongs as a storage destination of other containers of the same type as the container to be stored.

With this configuration, even if, for example, the type of containers to be stored in the storage rack is not known in advance, containers of a specific type can be posteriorly assigned to a specific storage section group. In addition, since containers of a specific type are posteriorly assigned to a specific storage section group, the storage positions of the containers when being stored in the storage rack will not be subjected to excessive constraints.

It is preferable as one mode that the gas supply device has, for each of the storage section groups, one flow rate adjustment unit configured to adjust a flow rate of the cleaning gas, and the flow rate adjustment unit for each of the storage section groups adjusts the flow rate of the cleaning gas in accordance with the type of containers stored in the storage sections that belong to the storage section group.

With this configuration, the flow rate of actually supplied cleaning gas can be made as uniform as possible even among a plurality of containers stored in storage sections that belong to different storage section groups. The flow rate of the cleaning gas that is actually supplied to the containers can be made as uniform as possible over the entire storage rack, with simple control to adjust the flow rate in accordance with the container type for each of the storage section groups.

It is preferable as one mode that the gas supply device supplies the cleaning gas from a gas source to the storage sections for each of the storage section groups via a supply pipe having a plurality of branch pipes, the storage section groups include a normal storage section group to which a reference number of storage sections belong, and a special storage section group to which a smaller number of storage sections than the reference number belong, and the control unit controls the operation of the transport apparatus so as to transport containers having a ventilation resistance greater than or equal to a predetermined reference resistance value to the storage sections that belong to the special storage section group.

With this configuration, since the number of storage sections that belong to the special storage section group is smaller than the number of storage sections that belong to the normal storage section group, the number of branches of the supply pipe that lead to the storage sections in the special storage section group is accordingly smaller than the number of branches of the supply pipe that lead to the storage sections in the normal storage section group. For this reason, the flow rate of the cleaning gas supplied to the storage sections in the special storage section group can be increased without any significant adjustment of the flow rate of the cleaning gas supplied from the gas source. As a result, the inside of the containers with high ventilation resistance can be appropriately cleaned by performing a simple control to store the containers in the storage sections in the special storage section group.

The invention claimed is:

1. A container storage facility comprising:

a storage rack having a plurality of storage sections in a state of being segmented into a plurality of storage section groups;

a gas supply device configured to supply a cleaning gas to the storage sections for each of the storage section groups;

a transport apparatus configured to transport containers to the storage sections; and a control unit comprising an information acquiring device, wherein the control unit is configured to control operation of the transport apparatus, wherein the control unit is configured such that the information acquiring device determines a value of ventilation resistance of the containers when the cleaning gas flows through the containers, and wherein the control unit categorizes the containers into a plurality of types according to the value of the ventilation resistance determined by the information acquiring device, and wherein the control unit is configured such that when a plurality of containers are to be stored in the storage sections, the control unit controls the operation of the transport apparatus so as to transport containers of the same type to the storage sections that belong to the same storage section group.

2. The container storage facility according to claim 1, wherein, when a container is to be stored in one of the storage sections, if no container of the same type as the container to be stored is stored, the control unit controls the operation of the transport apparatus so as to transport the container to one of the storage sections that belong to an empty one of the storage section groups in which no container is stored in any of the storage sections, and sets the storage section group to which the storage section to which the container to be stored is transported belongs as a storage destination of other containers of the same type as the container to be stored.

3. The container storage facility according to claim 1, wherein the gas supply device has, for each of the storage section groups, one flow rate adjustment unit configured to adjust a flow rate of the cleaning gas, and wherein the flow rate adjustment unit for each of the storage section groups adjusts the flow rate of the cleaning gas in accordance with the type of containers stored in the storage sections that belong to the storage section group.

4. The container storage facility according to claim 1, wherein:

the gas supply device supplies the cleaning gas from a gas source to the storage sections for each of the storage section groups via a supply pipe having a plurality of branch pipes, the storage section groups include a normal storage section group to which a reference number of storage sections belong, and a special storage section group to which a smaller number of storage sections than the reference number belong, and the control unit controls the operation of the transport apparatus so as to transport containers having a ventilation resistance greater than or equal to a predetermined reference resistance value to the storage sections that belong to the special storage section group.

5. The container storage facility according to claim 1, wherein the containers vary in the value of ventilation resistance when the cleaning gas flows through the containers in accordance with combinations of manufacturers and types of the containers, and wherein the information acquiring device obtains information of the manufacturers and types of the containers, and the control unit categorizes the containers into the plurality of the types based on the information of the manufacturers and types of the containers obtained by the information acquiring device.

* * * * *